(12) United States Patent
Cheng et al.

(10) Patent No.: US 8,530,974 B2
(45) Date of Patent: Sep. 10, 2013

(54) CMOS STRUCTURE HAVING MULTIPLE THRESHOLD VOLTAGE DEVICES

(75) Inventors: Kangguo Cheng, Schenectady, NY (US); Bruce B. Doris, Brewster, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/472,680

(22) Filed: May 16, 2012

(65) Prior Publication Data

US 2013/0062704 A1    Mar. 14, 2013

Related U.S. Application Data

(62) Division of application No. 13/227,750, filed on Sep. 8, 2011.

(51) Int. Cl.
*H01L 27/092* (2006.01)

(52) U.S. Cl.
USPC ........... 257/369; 257/374; 257/410; 257/412; 257/E27.062; 257/E27.064

(58) Field of Classification Search
USPC .................. 257/369, 410, 412, 374, E27.062, 257/E27.064
See application file for complete search history.

(56) References Cited

U.S. PATENT DOCUMENTS

| | | | |
|---|---|---|---|
| 4,256,514 A | 3/1981 | Pogge | |
| 5,494,843 A | 2/1996 | Huang | |
| 5,716,861 A | 2/1998 | Moslehi | |
| 5,949,105 A | 9/1999 | Moslehi | |
| 5,960,270 A | 9/1999 | Misra et al. | |
| 5,985,726 A | 11/1999 | Yu et al. | |
| 6,087,231 A | 7/2000 | Xiang et al. | |
| 6,096,641 A | 8/2000 | Kunikiyo | |
| 6,139,647 A | 10/2000 | Armacost et al. | |
| 6,225,173 B1 | 5/2001 | Yu | |
| 6,248,675 B1 | 6/2001 | Xiang et al. | |
| 6,271,094 B1 | 8/2001 | Boyd et al. | |
| 6,291,282 B1 | 9/2001 | Wilk et al. | |
| 6,297,132 B1 | 10/2001 | Zhang et al. | |
| 6,300,201 B1 | 10/2001 | Shao et al. | |
| 6,303,418 B1 | 10/2001 | Cha et al. | |
| 6,319,807 B1 | 11/2001 | Yeh et al. | |
| 6,346,438 B1 | 2/2002 | Yagishita et al. | |
| 6,353,249 B1 | 3/2002 | Boyd et al. | |
| 6,573,134 B2 | 6/2003 | Ma et al. | |
| 6,607,950 B2 | 8/2003 | Henson et al. | |
| 6,677,646 B2 | 1/2004 | Ieong et al. | |
| 6,897,520 B2 | 5/2005 | Vora | |
| 7,208,797 B2 | 4/2007 | Yagishita et al. | |
| 7,696,036 B2 * | 4/2010 | Bu et al. ......................... 438/216 |
| 7,723,798 B2 | 5/2010 | Doris et al. | |
| 7,732,344 B1 | 6/2010 | Tsai et al. | |
| 7,807,525 B2 | 10/2010 | Doris et al. | |

(Continued)

*Primary Examiner* — Mary Wilczewski

(74) *Attorney, Agent, or Firm* — Cantor Colburn LLP; Matthew Zehrer

(57) ABSTRACT

A complementary metal oxide semiconductor (CMOS) structure having multiple threshold voltage devices includes a first transistor device and a second transistor device formed on a semiconductor substrate. A set of vertical oxide spacers selectively formed for the first transistor device are in direct contact with a gate dielectric layer of the first transistor device such that the first transistor device has a shifted threshold voltage with respect to the second transistor device.

5 Claims, 12 Drawing Sheets

(56) References Cited

U.S. PATENT DOCUMENTS

| | | |
|---|---|---|
| 7,888,195 B2 | 2/2011 | Lin et al. |
| 7,947,588 B2 | 5/2011 | Yu et al. |
| 7,985,690 B2 | 7/2011 | Thei et al. |
| 8,035,173 B2 * | 10/2011 | Bu et al. ................ 257/410 |
| 8,084,824 B2 | 12/2011 | Yu et al. |
| 8,202,776 B2 | 6/2012 | Chang et al. |
| 2002/0025638 A1 | 2/2002 | Yeh et al. |
| 2005/0090066 A1 | 4/2005 | Zhu et al. |
| 2006/0065939 A1 | 3/2006 | Doczy et al. |
| 2008/0272438 A1 * | 11/2008 | Doris et al. ............. 257/369 |
| 2008/0308872 A1 | 12/2008 | Bu et al. |
| 2009/0298245 A1 | 12/2009 | Doris et al. |
| 2010/0052074 A1 | 3/2010 | Lin et al. |
| 2010/0059833 A1 | 3/2010 | Yu et al. |
| 2010/0148273 A1 | 6/2010 | Bu et al. |
| 2010/0270627 A1 | 10/2010 | Chang et al. |
| 2010/0289085 A1 | 11/2010 | Yuan et al. |
| 2010/0311231 A1 | 12/2010 | Thei et al. |
| 2011/0018072 A1 | 1/2011 | Lin et al. |
| 2011/0147853 A1 | 6/2011 | Lin et al. |
| 2011/0254093 A1 | 10/2011 | Wang et al. |
| 2012/0104509 A1 | 5/2012 | Matsumoto |
| 2012/0108074 A1 | 5/2012 | Kinoshita |

* cited by examiner

CMOS STRUCTURE HAVING MULTIPLE THRESHOLD VOLTAGE DEVICES

CROSS-REFERENCE TO RELATED APPLICATION

This application is a divisional of U.S. patent application Ser. No. 13/227,750, filed Sep. 8, 2011, the disclosure of which is incorporated by reference herein in its entirety.

BACKGROUND

The present invention relates generally to semiconductor device processing techniques and, more particularly, to a complementary metal oxide semiconductor (CMOS) structure having multiple threshold voltage devices.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric.

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below a thickness of about 1.1 nm for the silicon oxide gate dielectric.

Accordingly, recent MOS and CMOS transistor scaling efforts have focused on high-k dielectric materials having dielectric constants greater than that of $SiO_2$ (e.g., greater than about 3.9). High-k dielectric materials can be formed in a thicker layer than scaled $SiO_2$, and yet still produce equivalent field effect performance. The relative electrical performance of such high-k dielectric materials is often expressed in terms equivalent oxide thickness (EOT), since the high-k material layer may be thicker, while still providing the equivalent electrical effect of a much thinner layer of $SiO_2$. Because the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY

In an exemplary embodiment, a method of forming a complementary metal oxide semiconductor (CMOS) structure having multiple threshold voltage devices includes forming a first transistor device and a second transistor device on a semiconductor substrate, the first transistor device and second transistor device initially having sacrificial dummy gate structures; and removing the sacrificial dummy gate structures and selectively forming a set of vertical oxide spacers for the first transistor device, the set of vertical oxide spacers being in direct contact with a gate dielectric layer of the first transistor device such that the first transistor device has a shifted threshold voltage with respect to the second transistor device.

In another embodiment, a complementary metal oxide semiconductor (CMOS) structure having multiple threshold voltage devices. The structure includes a first transistor device and a second transistor device formed on a semiconductor substrate; and a set of vertical oxide spacers selectively formed for the first transistor device, the set of vertical oxide spacers being in direct contact with a gate dielectric layer of the first transistor device such that the first transistor device has a shifted threshold voltage with respect to the second transistor device.

BRIEF DESCRIPTION OF THE SEVERAL VIEWS OF THE DRAWINGS

Referring to the exemplary drawings wherein like elements are numbered alike in the several Figures:

FIGS. 1 through 8 are a sequence of cross sectional views illustrating a method of forming a CMOS structure having multiple threshold voltage devices in accordance with an embodiment of the invention, in which:

FIG. 1 illustrates an exemplary semiconductor substrate;

FIG. 2 illustrates a shallow trench isolation (STI) region formed in the substrate;

FIG. 3 illustrates the formation of first and second transistor devices on the substrate, on opposing sides of the STI region;

FIG. 4 illustrates the removal of dummy gate structures of the first and second transistor devices;

FIG. 5 illustrates formation of an oxide layer over the structure of FIG. 4;

FIG. 6 illustrates removal of horizontal portions of the oxide layer so as to form vertical oxide spacers in contact with the high-k gate dielectric layers of the first and second transistor devices;

FIG. 7 illustrates selective removal of the vertical oxide spacers of the second transistor device;

FIG. 8 illustrates metal gate filling of the first and second transistor devices;

FIGS. 9 through 13 are a sequence of cross sectional views illustrating an alternative embodiment of the process flow of FIGS. 4 through 8, in which:

FIG. 9 illustrates the removal of dummy gate structures of the first and second transistor devices of FIG. 3, including dummy gate dielectric layers;

FIG. 10 illustrates formation of an oxide layer over the structure of FIG. 9;

FIG. 11 illustrates removal of horizontal portions of the oxide layer so as to form vertical oxide spacers;

FIG. 12 illustrates selective removal of the vertical oxide spacers of the second transistor device; and FIG. 13 illustrates high-k gate dielectric layer and metal gate filling of the first and second transistor devices, with the vertical oxide spacers of the first transistor device being in contact with the high-k gate dielectric layer.

DETAILED DESCRIPTION

Figure 1:
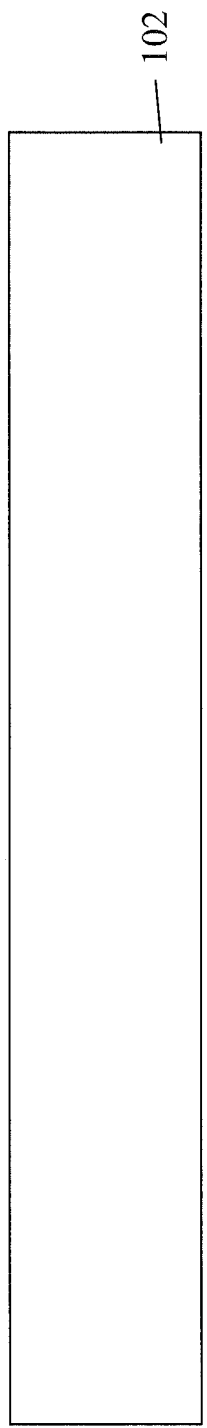

In general, CMOS integration requires two gate materials, one having a work function near the valence band edge of the semiconductor material in the channel and the other having a work function near the conduction band edge of the same semiconductor material. In CMOS devices having a silicon channel, a conductive material having a work function of about 4.0 eV is typically necessary for n-type metal oxide semiconductor field effect transistors (NFETs) and another conductive material having a work function of about 5.0 eV is typically necessary for p-type metal oxide semiconductor field effect transistors (PFETs). In conventional CMOS devices employing polysilicon gate materials, a heavily p-doped polysilicon gate and a heavily n-doped polysilicon gate are employed to address the needs. However, in CMOS devices employing high-k gate dielectric materials as discussed above, suitable materials satisfying the work function requirements are needed. So far, identification of materials for a dual work function metal gate electrode system has presented some challenges.

One approach in implementing high-k dielectrics in CMOS devices is to employ heavily doped polysilicon materials along with high-k gate dielectric materials in the gates. A threshold voltage ($V_t$) offset is observed, however, when high-k gate dielectric materials are integrated with polysilicon gate electrodes, which can be as much as 600 mV for p-type metal oxide semiconductor (PMOS) devices. The source of the offset is in general believed to be oxygen vacancies, or oxygen deficiencies, as well as Fermi-level pinning due to metal-silicon bonds in the high-k gate dielectrics. While metal gate electrodes tend to mitigate the threshold voltage offset effect, no solution has been proposed to fundamentally address the $V_t$ shift in high-k dielectric gates having a polysilicon gate conductor.

A replacement gate process architecture avoids the problems of work function material stability seen in the gate first architecture. Here, a dummy gate structure is used to self-align the source and drain implant and anneals, followed by stripping out the dummy gate materials and replacing them with the high-k and metal gate materials. Although this process is more complex than a gate first technique, advantages of a replacement gate flow include the use of separate PMOS and NMOS metals for work function optimization. In addition, the two metals are not exposed to high temperatures, simplifying material selection. Further, the polysilicon gate removal can actually be used to enhance strain techniques, thereby increasing drive currents.

System-On-a-Chip (SOC) applications require transistors formed on a common substrate and having a plurality of different threshold voltages. Both high-k, metal gate first and gate last fabrication schemes have challenges with respect to achieving $V_t$ adjustment to the desired threshold voltages. One way to adjust such threshold voltages, for example, by lowering $V_t$ for PFET devices and increasing $V_t$ for NFET with high-k metal gates is to fill oxygen vacancies in the high-k (e.g., hafnium oxide) dielectric layer. Disclosed herein are embodiments directed to an innovative processing scheme resulting in a unique CMOS device structure having modulated threshold voltages. Such a scheme may be used, for example, to create low and high $V_t$ PFETs and NFETs. In brief, the embodiments utilize an oxide spacer that comes into physical contact with the high-k layer. The oxygen in the oxide spacer delivers oxygen to the high-k layer for a first transistor device to shift the $V_t$ (lower or higher depending upon the device polarity) for the first FET device, while a second FET device does not include the oxide spacer. In that manner, the $V_t$ for the first FET is different from that of the second FET.

Referring generally to FIGS. 1 through 8, there is shown a series of cross sectional views of an exemplary embodiment of a method of forming a CMOS structure having multiple threshold voltage devices in accordance with an embodiment of the invention. FIG. 1 illustrates an exemplary semiconductor substrate 102 suitable for use in this regard. The semiconductor substrate 102 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Where the semiconductor material of the semiconductor substrate 102 is a single crystalline silicon-containing semiconductor material, the single crystalline silicon-containing semiconductor material may be selected from single crystalline silicon, a single crystalline silicon carbon alloy, a single crystalline silicon germanium alloy, and a single crystalline silicon germanium carbon alloy.

The semiconductor material of the semiconductor substrate 102 may be appropriately doped either with p-type dopant atoms or with n-type dopant atoms. The dopant concentration of the semiconductor substrate 102 may range from about $1.0 \times 10^{15}$ atoms/cm$^3$ to about $1.0 \times 10^{19}$ atoms/cm$^3$, and more specifically from about $1.0 \times 10^{16}$ atoms/cm$^3$ to about $3.0 \times 10^{18}$ atoms/cm$^3$, although lesser and greater dopant concentrations are contemplated herein also. In addition, the semiconductor substrate 102 may be a bulk substrate, a semiconductor-on-insulator or silicon-on-insulator (SOI) substrate, or a hybrid substrate.

Figure 2:
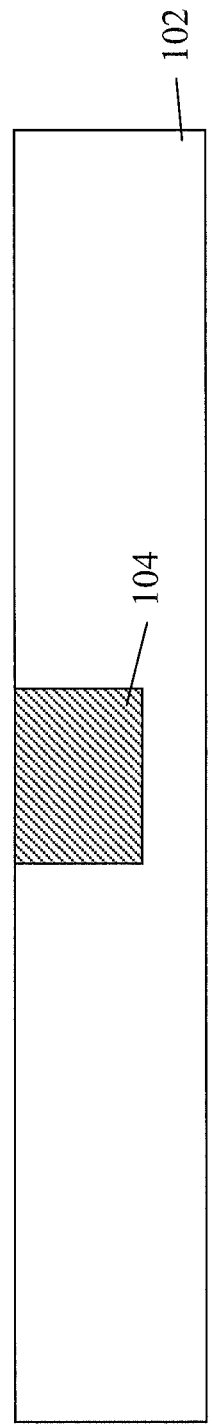

FIG. 2 illustrates an isolation region 104, such as shallow trench isolation (STI), formed in the substrate 102. The STI region 104 may include a dielectric material such as silicon oxide and/or silicon nitride, and is formed by methods well known in the art.

Figure 3:
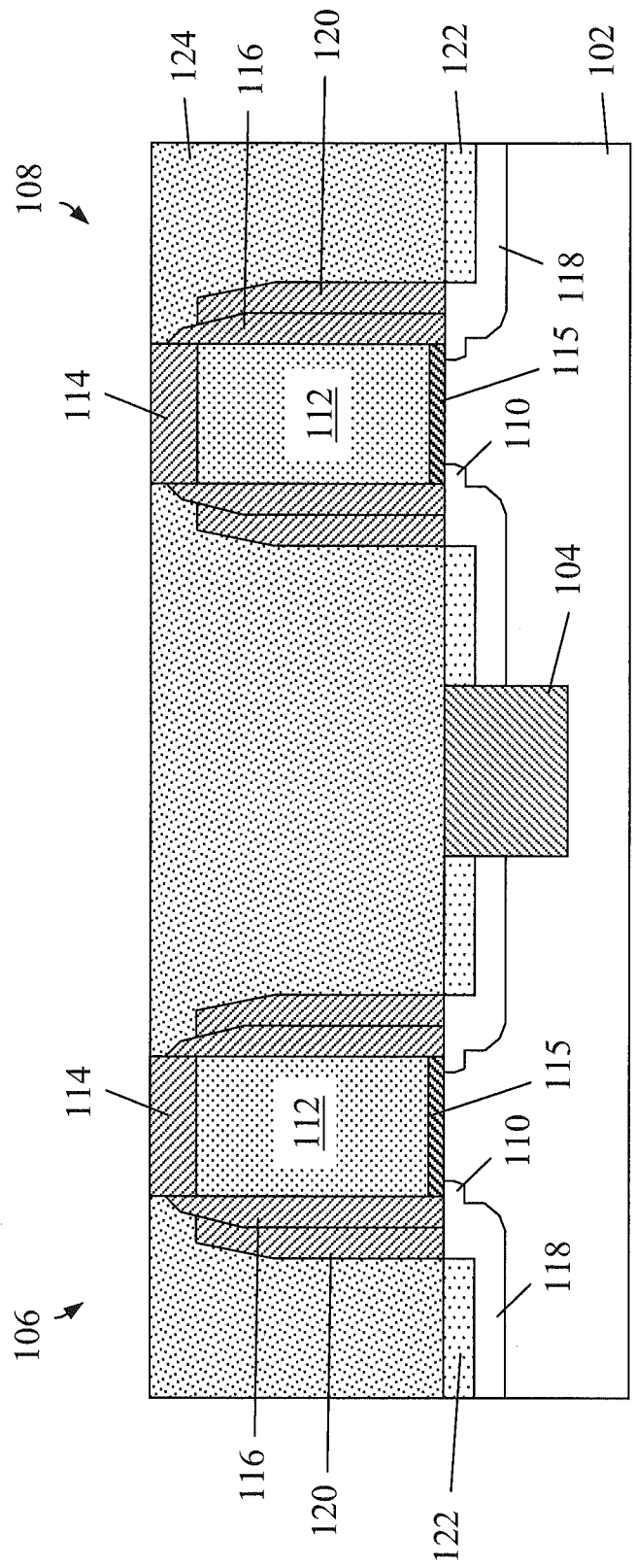

FIG. 3 illustrates the formation of first and second transistor devices 106, 108, on the substrate 102, on opposing sides of the STI region 104. Here, the semiconductor structure is an example of replacement gate FET technology. Thus, the first transistor device 106 and the second transistor device 108 include source and drain extension regions 110 formed, for example, by ion implantation or other known techniques with a dummy gate structure 112 (including cap layer 114) formed on a high-k gate dielectric layer 115 and first sidewall spacers 116 in place. The source and drain extension regions 110 have a doping of the same or opposite conductivity type of the doping of the substrate 102. Source and drain regions 118 are also depicted in FIG. 3, which are formed, for example, by ion implantation or other known techniques of the same conductivity type as the extension regions 110. The first and second sidewall spacers 116, 120 are formed, for example, by deposition of a dielectric material layer (e.g., an oxygen-impermeable material such as silicon nitride) followed by an anisotropic etching process such as reactive ion etch (RIE). Silicide contacts 122 for the source and drain regions are also depicted in FIG. 3. It will be noted that the silicide contacts 122 may be formed before or after the formation of the final metal gate.

Although not specifically shown in FIG. 3, an interfacial layer (IL) may be formed on the exposed semiconductor surface of the substrate 102 between the first sidewall spacers 116 such as, for example, by a wet chemical oxidation that includes treating the cleaned semiconductor surface 102 (e.g., by hydrofluoric acid) with a mixture of ammonium hydroxide, hydrogen peroxide and water (in a 1:1:5 ratio) at 65° C. Alternatively, a chemical oxide layer can also be formed by treating the HF-last semiconductor surface in ozonated aqueous solutions, with the ozone concentration usually varying from, but not limited to: 2 parts per million (ppm) to 40 ppm. However, it will be appreciated that an IL layer may be formed by other processes known in the art such as, for example, by atomic layer deposition (ALD) of $SiO_2$ or by rapid thermal anneal (RTA) in an $O_2$ or $NH_3$ ambient environment. The formation of an IL allows for nucleation of the high-k dielectric layer 115 formed thereon, which has a dielectric constant that is greater than the dielectric constant (7.5) of silicon nitride.

The high-k dielectric layer 115 may be formed by methods well known in the art including, for example, chemical vapor deposition (CVD), ALD, molecular beam deposition (MBD), pulsed laser deposition (PLD), liquid source misted chemical deposition (LSMCD), etc. In an exemplary embodiment, the high-k dielectric layer 118 includes a metal and oxygen, and optionally nitrogen and/or silicon. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 115 may be from about 1 nm to about 10 nm, and more specifically from about 1.5 nm to about 3 nm.

Prior to removal of the dummy gate structure, an interlevel dielectric (ILD) layer 124 is formed over top surfaces the device. The ILD layer 124 includes a dielectric material such as silicon oxide, silicon nitride, silicon oxynitride, or a combination thereof. Alternatively, the ILD layer 124 may include a low-k dielectric material having a dielectric constant less than 3.9 (e.g., the dielectric constant of silicon oxide), and more specifically less than 2.5. Exemplary low-k dielectric materials include organosilicate glass (OSG) and SiLK®. The ILD layer 124 is planarized to expose a top surface of the dummy gate structure, such as cap layer 114.

Figure 4:
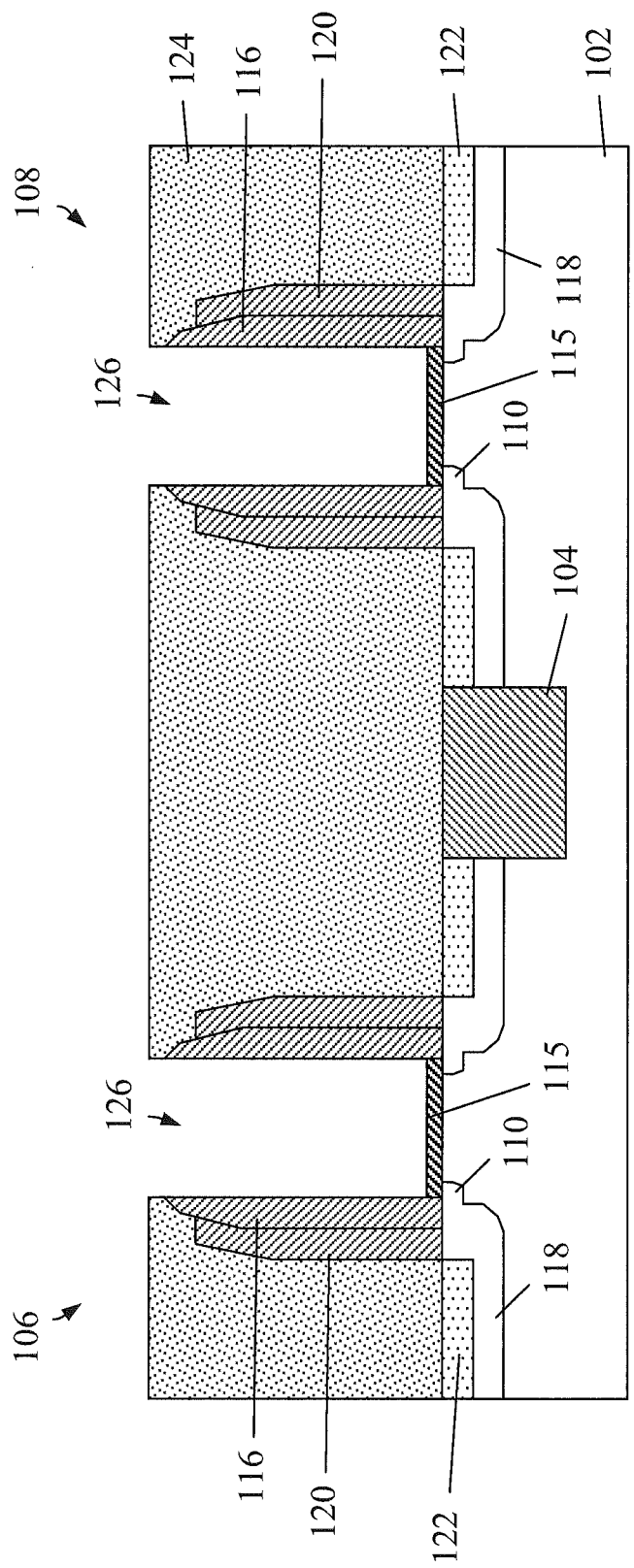

FIG. 4 illustrates the removal of dummy gate structures of the first and second transistor devices 106, 108. In accordance with a replacement gate process, FIG. 4 shows the dummy gate structure 112 (and cap layer 114) being removed, such as through one or more etch processes, so as to form a recess 126 that exposes a top surface of the high-k gate dielectric 115. In a further embodiment described below, the gate dielectric layer 115 could also be a dummy structure such that the recess 126 would expose the top surface of the substrate 102.

Figure 5:
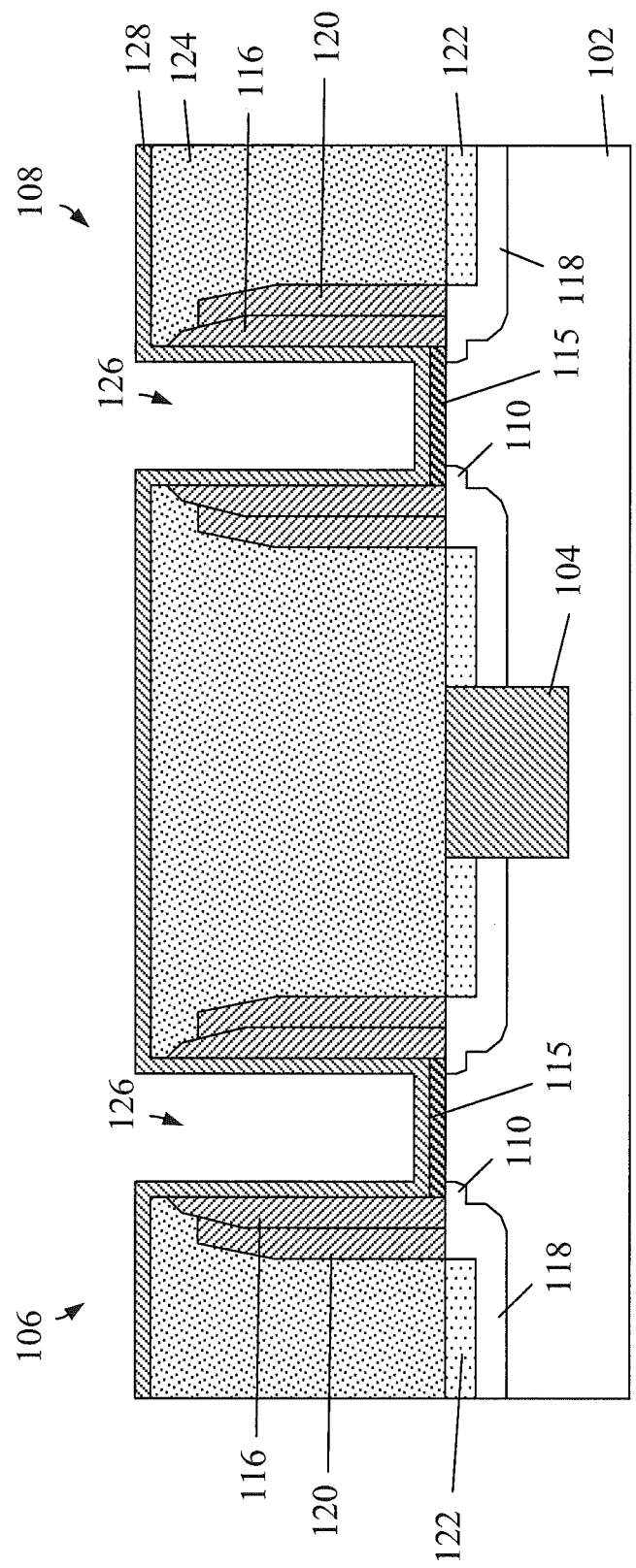
Figure 6:
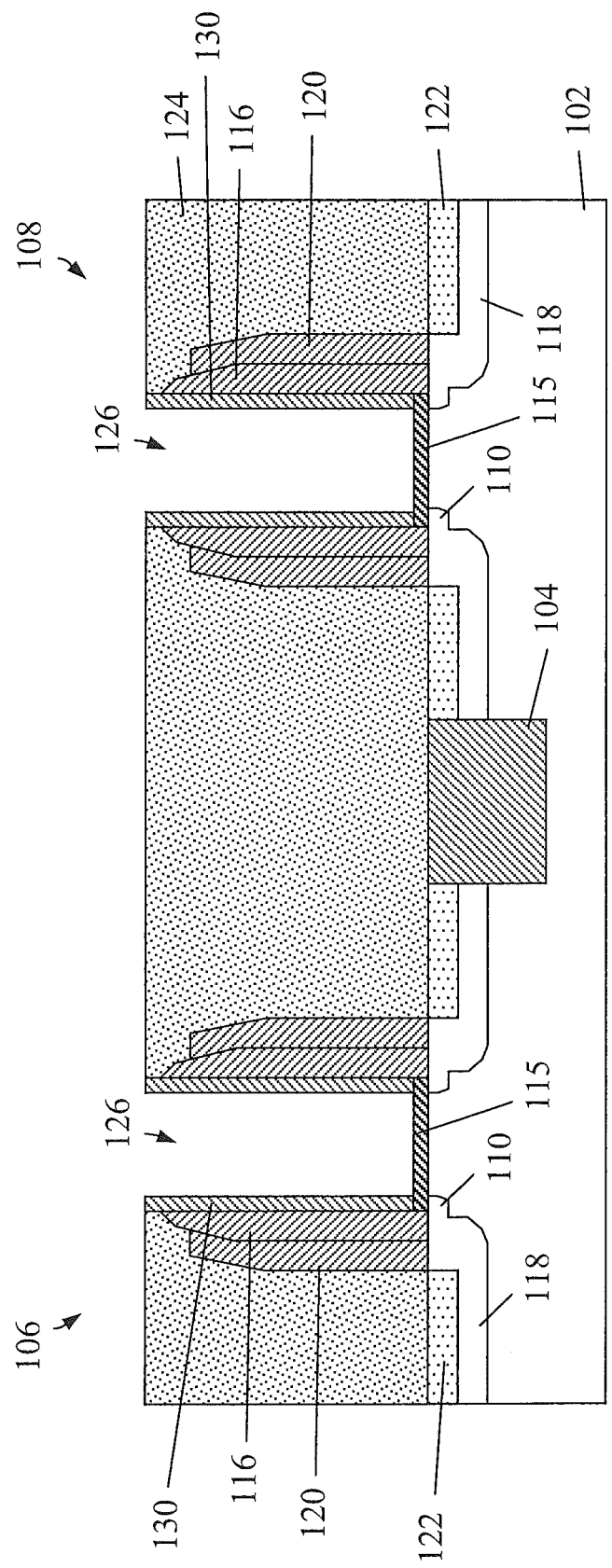

As then shown in FIG. 5, a conformal oxide layer 128 (e.g., silicon oxide) is then deposited over the structure of FIG. 4, including over top surfaces of the ILD layer 124, sidewalls of first spacers 116 and the top surface of high-k layer 115. This may be implemented by, for example, a chemical vapor deposition (CVD) process. In FIG. 6, horizontal portions of the conformal oxide layer 128 are anisotropically removed so as to form vertical oxide spacers 130 in contact with the high-k gate dielectric layers 115 of the first and second transistor devices.

Figure 7:
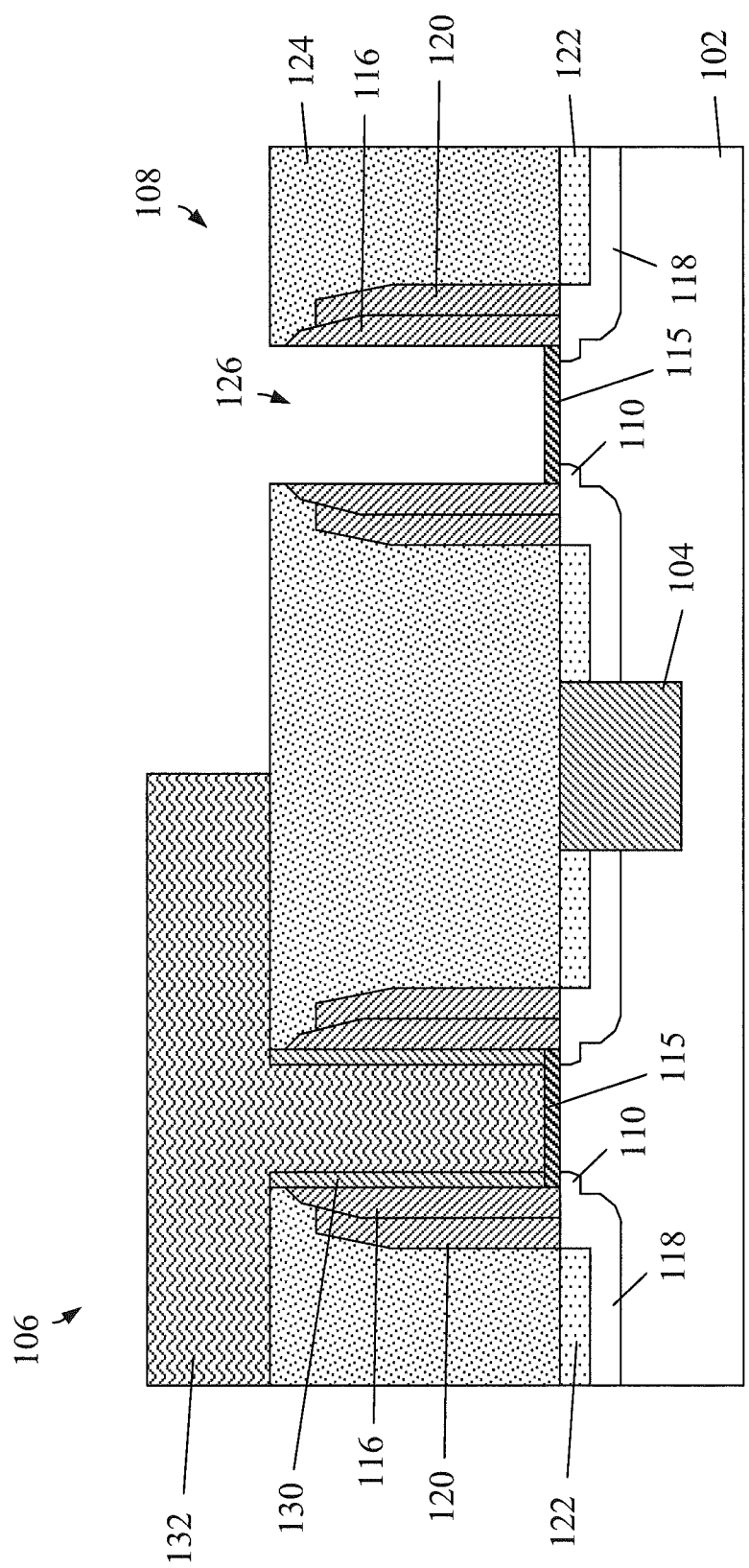

Referring next to FIG. 7, a blocking mask layer 132 is formed over the device and is thereafter patterned so as expose the second transistor device 108. This allows for selective removal of the vertical oxide spacers 130 of the second transistor device 108 that in turn results in the desired threshold voltage variation between the first and second transistor devices 106, 108. Removal of the vertical oxide spacers 130 of the second transistor device 108 may be performed by, for example, a wet hydrofluoric (HF) acid etch.

Alternatively, the block mask 132 could be formed and selectively patterned after the deposition of the oxide spacer material but before the anisotropic etch to remove the horizontal portion of the oxide layer. Thereafter, the oxide layer is removed from the second transistor device 108 by, for example, a wet HF acid etch. The mask is the removed and an anisotropic etch such as RIE can be used to remove the horizontal portions of the oxide 128 over the first transistor device 106.

In another alternative approach, the block mask 132 could be formed and selectively patterned over the second transistor device 108 prior to the formation of the conformal oxide layer 128 in FIG. 5. With this scheme, the block mask would prevent the oxide layer from being formed inside the recess 126 of the second transistor device. Thereafter, the anisotropic dry etch would be used to remove the horizontal portions of the oxide 128 over the first transistor device 106. Regardless of the approach used, the net result is to form the vertical oxide spacers 130 only for the first transistor device 106.

Figure 8:
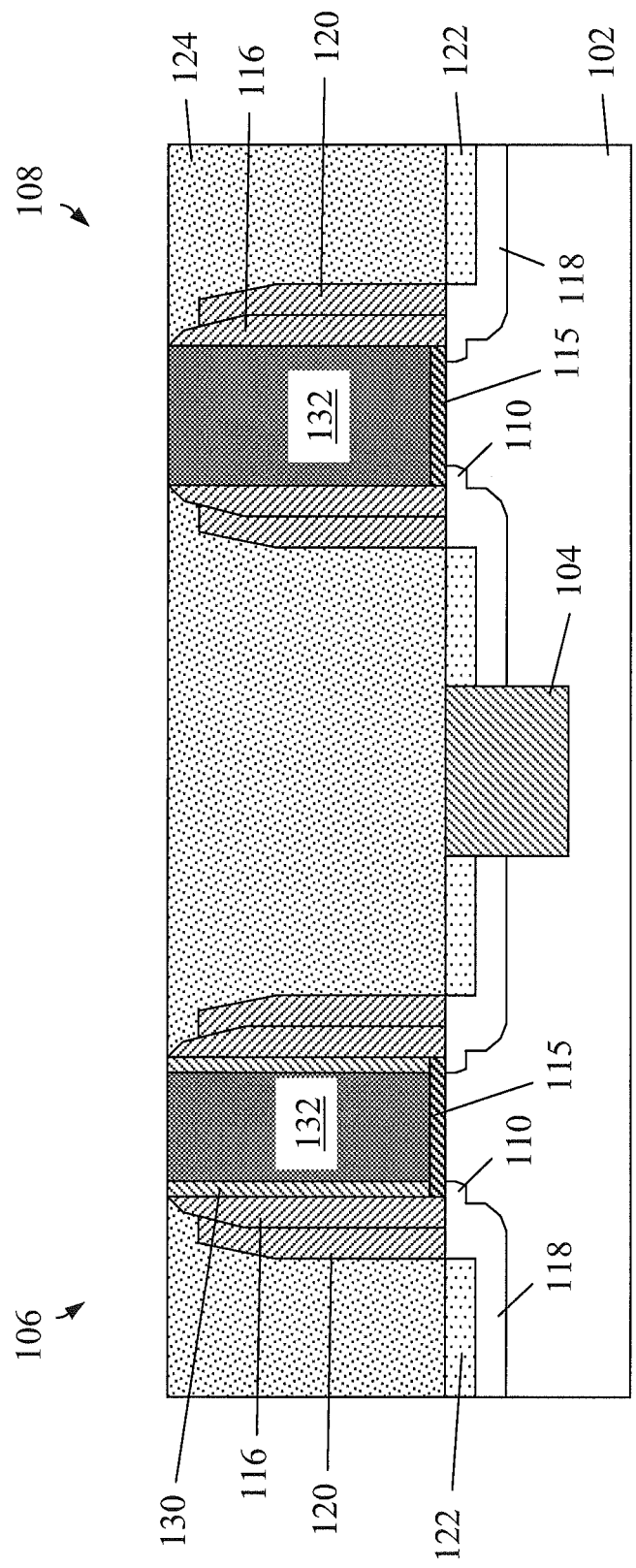

Once the vertical oxide spacers 130 are formed for the first transistor device 106, FIG. 8 illustrates metal gate filling and planarization of the first and second transistor devices 106, 108 with one or more metal gate fill materials 132, as known in the art. The metal gate fill materials 132 may include one or more layers of metal materials such as, for example, aluminum (Al), tantalum (Ta), tantalum nitride (TaN), tungsten (W), tungsten nitride (WN), titanium (Ti) and titanium nitride (TiN), having an appropriate workfunction depending on whether the transistor is an NFET or a PFET device. From this point, further CMOS device processing as known in the art may continue, such as the formation of additional wiring and dielectric layers for example.

Because of the presence of the vertical oxide spacers 130 in contact with the high-k gate dielectric layer 115 of the first transistor device, oxygen atoms may be diffused from the vertical oxide spacers 130 to the high-k gate dielectric layer 115 during subsequent thermal processing. This results in a modification of the $V_t$ (lower or higher depending upon the device polarity) for the first FET device 106 with respect to the second FET device 108 that does not include the vertical oxide spacers 130.

Figure 9:
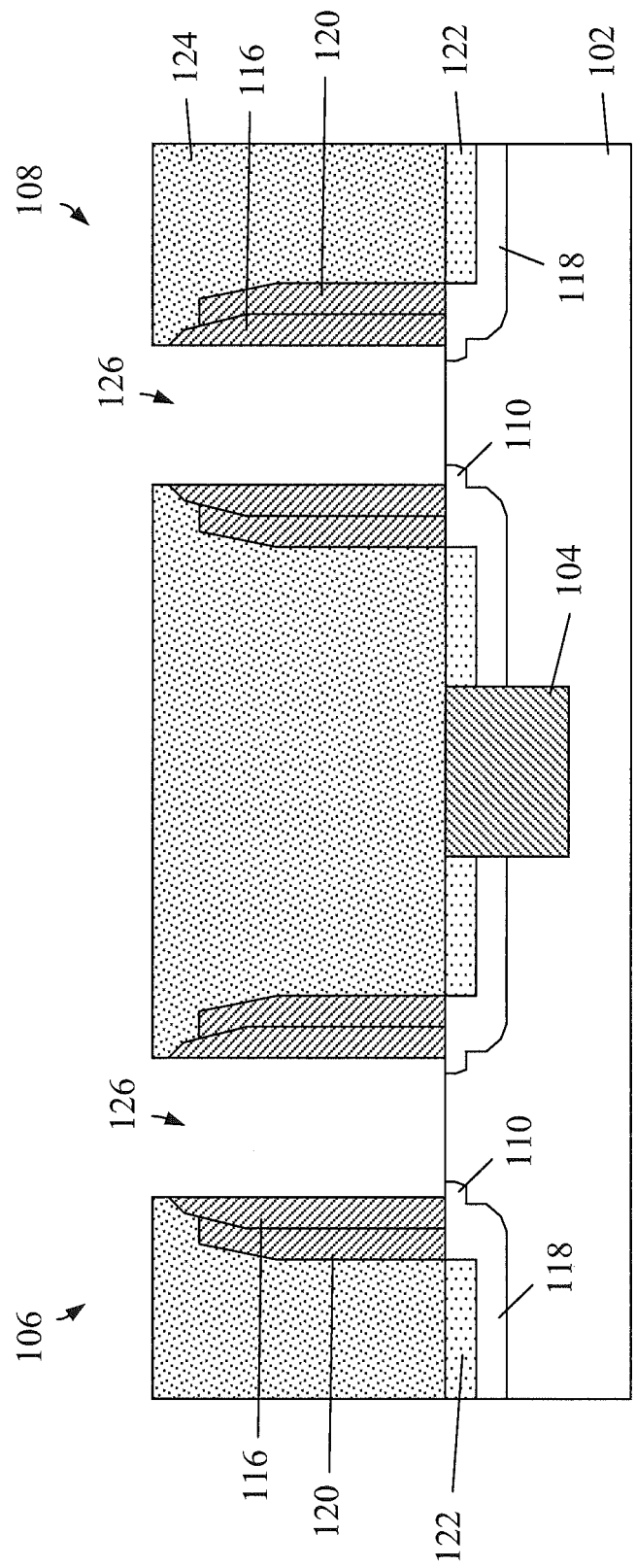

As indicated above, in lieu of a dummy gate structure atop a final high-k dielectric layer, the entire gate stack formed on the substrate 102 may be a sacrificial or dummy structure. In this regard, FIGS. 9 through 13 are a sequence of cross sectional views illustrating an alternative embodiment of the process flow of FIGS. 4 through 8. In particular, FIG. 9 illustrates the removal of dummy gate structures of the first and second transistor devices of FIG. 3, including dummy gate dielectric layers, such that the recesses 126 expose the top surface of the substrate 102.

Figure 10:
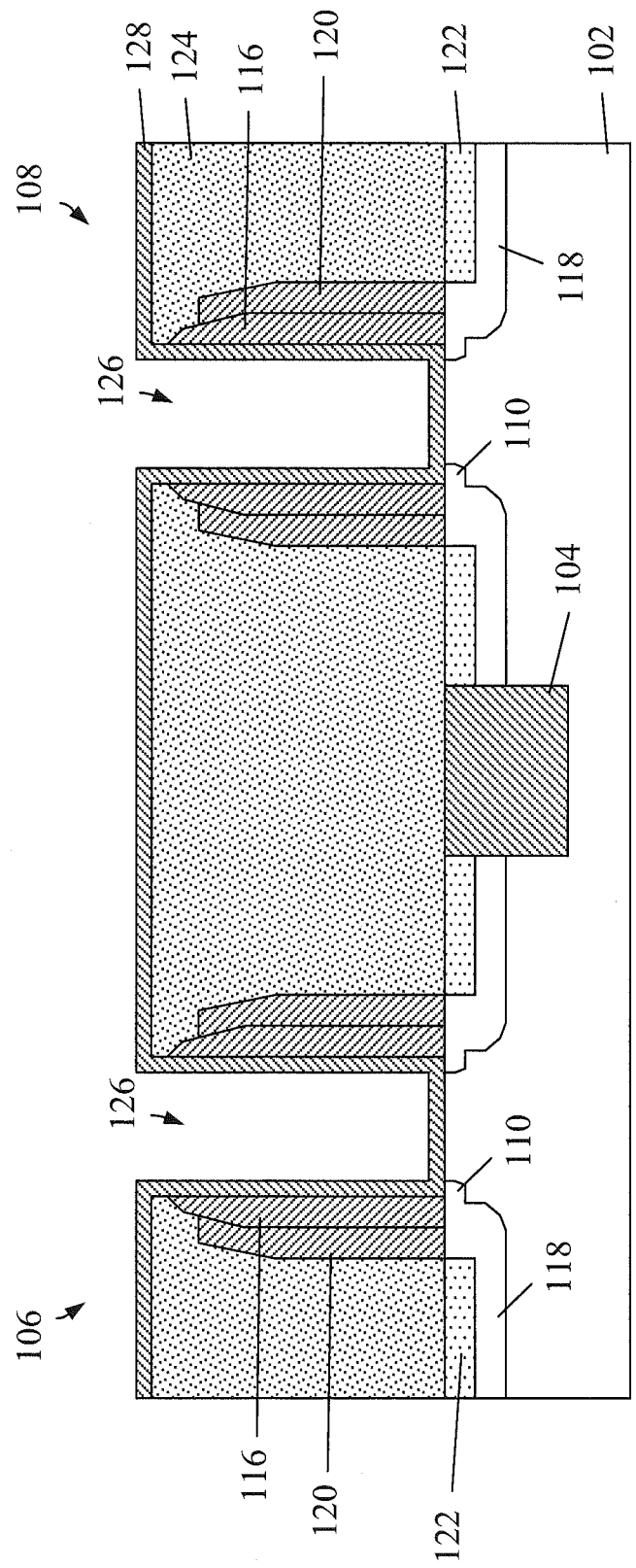
Figure 11:
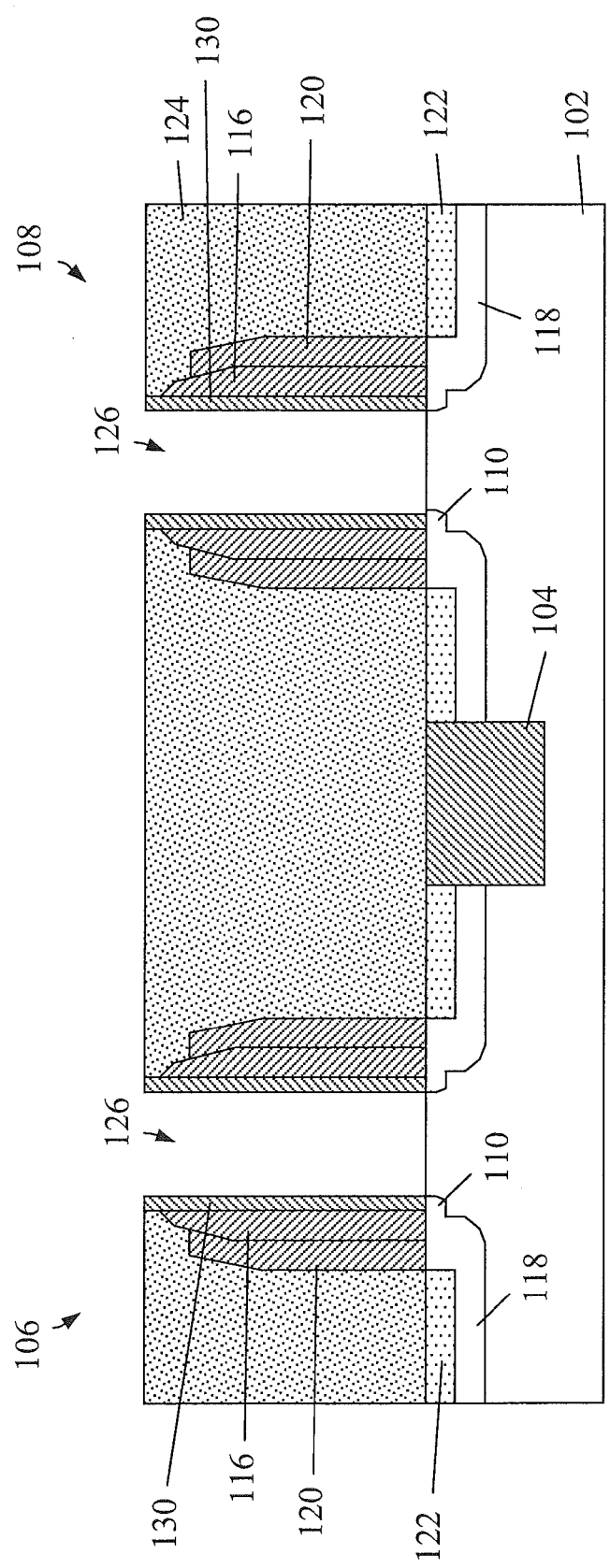

Then, as shown in FIG. 10, a conformal oxide layer 128 (e.g., silicon oxide) is deposited over the entire structure, including over top surfaces of the ILD layer 124, sidewalls of first spacers 116 and the top surface of the substrate 102. Again, this may be implemented by, for example, a CVD process. In FIG. 11, horizontal portions of the conformal oxide layer 128 are anisotropically removed so as to form vertical oxide spacers 130.

Figure 12:
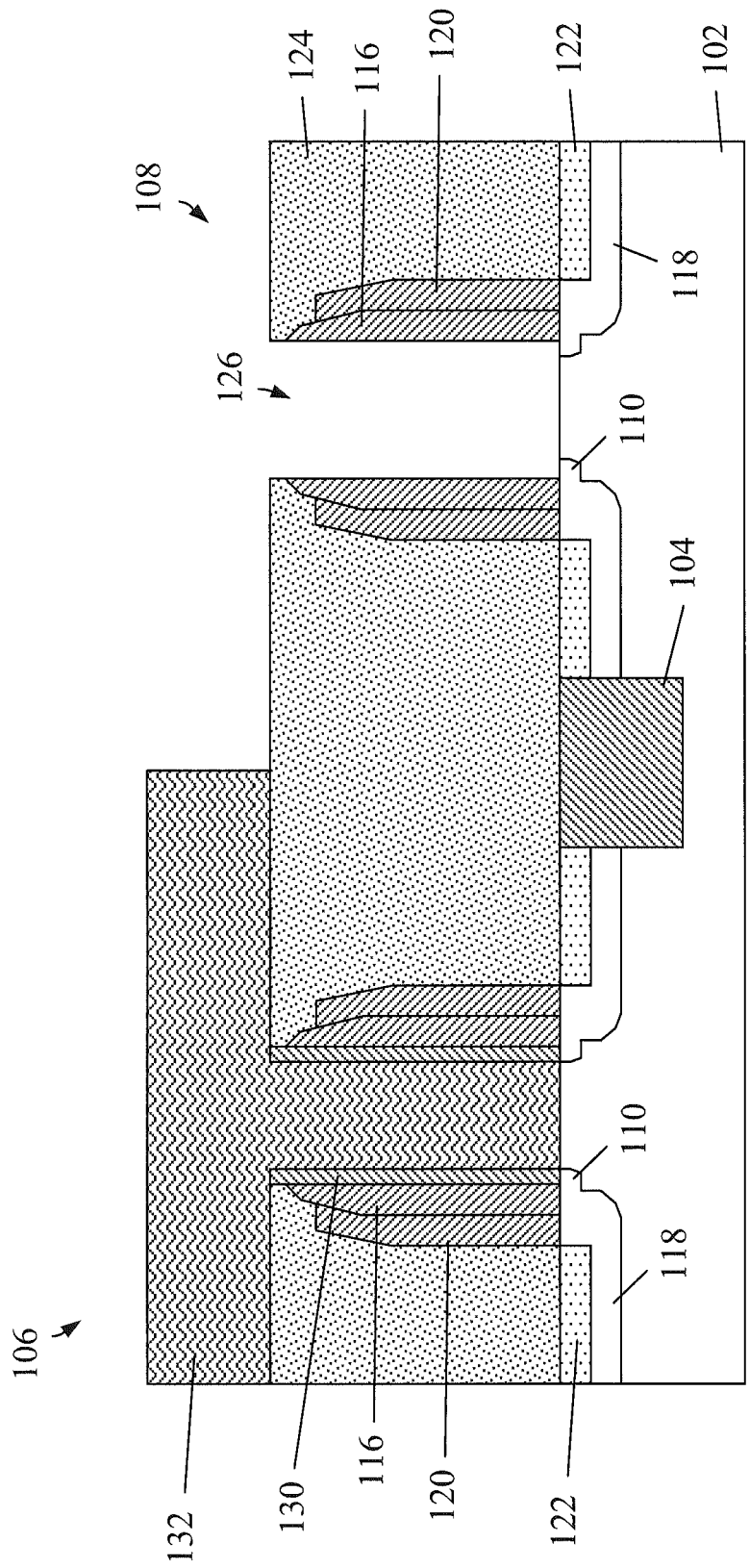

Referring next to FIG. 12, a blocking mask layer 132 is formed over the device and is thereafter patterned so as expose the second transistor device 108. This allows for selective removal of the vertical oxide spacers 130 of the second transistor device 108 that in turn results in the desired threshold voltage variation between the first and second transistor devices 106, 108. Removal of the vertical oxide spacers 130 of the second transistor device 108 may be performed by, for example, a wet HF acid etch.

Alternatively, the block mask 132 could be formed and selectively patterned after the deposition of the oxide spacer material but before the anisotropic etch to remove the horizontal portion of the oxide layer. Thereafter, the oxide layer is removed from the second transistor device 108 by, for example, a wet HF acid etch. The mask is the removed and an anisotropic etch such as RIE can be used to remove the horizontal portions of the oxide 128 over the first transistor device 106.

In another alternative approach, the block mask 132 could be formed and selectively patterned over the second transistor device 108 prior to the formation of the conformal oxide layer 128 in FIG. 10. With this scheme, the block mask would prevent the oxide layer from being formed inside the recess 126 of the second transistor device. Thereafter, the anisotropic dry etch would be used to remove the horizontal portions of the oxide 128 over the first transistor device 106. Regardless of the approach used, the net result is to form the vertical oxide spacers 130 only for the first transistor device 106.

Figure 13:
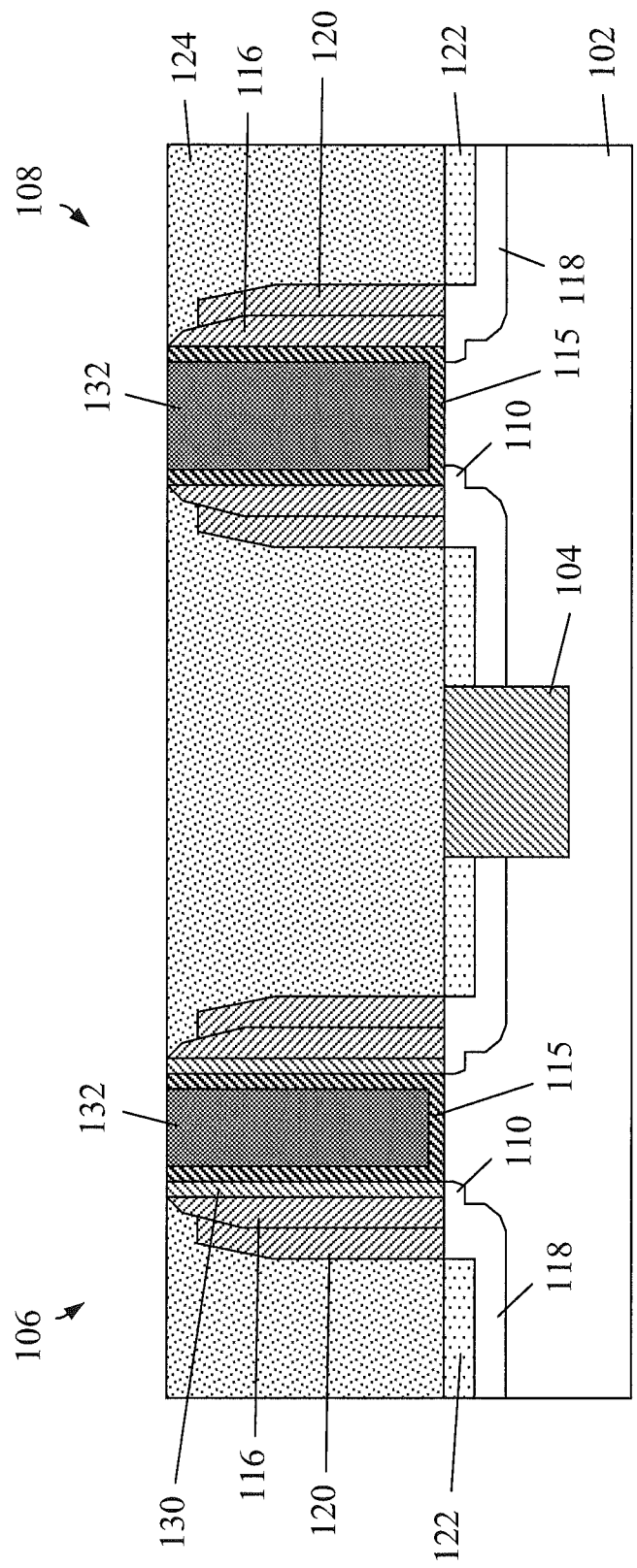

Once the vertical oxide spacers 130 are formed for the first transistor device 106, FIG. 13 illustrates gate-last filling and planarization of the first and second transistor devices 106, 108 with a high-k dielectric layer 115 and planarization one or more metal gate fill materials 132. In comparison with the embodiment of FIG. 8, it will be seen from FIG. 13 that the high-k dielectric layer 115, also has vertical portions that (for the first transistor device) are in direct contact with the vertical oxide spacers 130. Here again, the selective formation of vertical oxide spacers 130 only for the first transistor device 106 results in a modification of the $V_t$ (lower or higher depending upon the device polarity) for the first transistor device 106 with respect to the second FET device 108.

Finally, it should be appreciated that although the exemplary transistor embodiments depicted in the drawings are planar devices, the concepts disclosed herein also apply to non-planar devices such as, for example finFET devices, trigate transistors, nanowire transistors, and the like. Moreover, the transistor channel may either be doped or undoped. In particular, undoped channels are actually becoming more prevalent for fully depleted devices such as finFET, tri-gate, fully depleted SOI, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A complementary metal oxide semiconductor (CMOS) structure having multiple threshold voltage devices, the structure comprising:
    a first transistor device and a second transistor device formed on a semiconductor substrate; and
    a set of vertical oxide spacers selectively formed only for the first transistor device, the set of vertical oxide spacers being in direct contact with a high-k gate dielectric layer of the first transistor device such that the first transistor device has a shifted threshold voltage with respect to the second transistor device, and the set of vertical oxide spacers provides a source of diffused oxygen atoms to the high-k gate dielectric layer so as to result in the shifted threshold voltage with respect to the second transistor device;
    wherein the high-k gate dielectric layer for the first transistor device has a vertical portion that directly abuts the set of vertical oxide spacers for the first transistor device, and wherein the vertical portion of the high-k gate dielectric layer for the first transistor device is disposed between the set of vertical oxide spacers for the first transistor device and a metal gate fill material, and wherein the high-k gate dielectric layer for the second transistor device has a vertical portion that directly abuts a set of nitride spacers for the second transistor device, and wherein the vertical portion of the high-k gate dielectric layer for the second transistor device is disposed between the set of nitride spacers for the second transistor device and the metal gate fill material.

2. The structure of claim 1, wherein the vertical oxide spacers comprise a silicon oxide layer.

3. The structure of claim 2, wherein the set of vertical oxide spacers for the first transistor device is formed directly atop the semiconductor substrate.

4. The structure of claim 1, wherein the high-k gate dielectric layer is formed from one or more of: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from 0.5 to 3 and each value of y is independently from 0 to 2.

5. The structure of claim 1, wherein the first transistor device and the second transistor device include a metal gate fill material comprising one or more of:
    aluminum (Al), tantalum (Ta), tantalum nitride (TaN), tungsten (W), tungsten nitride (WN), titanium (Ti) and titanium nitride (TiN).

* * * * *